(12) United States Patent
Galburt

(10) Patent No.: US 7,369,214 B2
(45) Date of Patent: May 6, 2008

(54) LITHOGRAPHIC APPARATUS AND DEVICE MANUFACTURING METHOD UTILIZING A METROLOGY SYSTEM WITH SENSORS

(75) Inventor: Daniel N. Galburt, Wilton, CT (US)

(73) Assignee: ASML Holding N.V. (NL)

( * ) Notice: Subject to any disclaimer, the term of this patent is extended or adjusted under 35 U.S.C. 154(b) by 24 days.

(21) Appl. No.: 11/201,162

(22) Filed: Aug. 11, 2005

(65) Prior Publication Data

US 2007/0035714 A1    Feb. 15, 2007

(51) Int. Cl.
G03B 27/52    (2006.01)
(52) U.S. Cl. ............................ 355/55; 356/399; 250/548
(58) Field of Classification Search ................. 355/53, 355/69, 55, 72; 356/237, 399; 250/548
See application file for complete search history.

(56) References Cited

U.S. PATENT DOCUMENTS

| 4,550,592 | A |   | 11/1985 | Dechape |         |
|-----------|---|---|---------|---------|---------|
| 4,953,388 | A |   | 9/1990  | Barada  |         |
| 5,825,043 | A | * | 10/1998 | Suwa    | 250/548 |
| 6,633,050 | B1|   | 10/2003 | Lyons   |         |
| 6,979,833 | B2|   | 12/2005 | Lyons   |         |
| 6,984,836 | B2| * | 1/2006  | Lyons   | 250/548 |
| 2004/0118183 | A1 |   | 6/2004 | Gajdeczko et al. | |
| 2004/0118184 | A1 |   | 6/2004 | Violette         | |
| 2005/0044963 | A1 |   | 3/2005 | Lyons            | |

OTHER PUBLICATIONS

Joseph Lyons, U.S. Appl. No. 11/256,938, filed Oct. 25, 2005, entitled "Virtual Gauging Method for Use in Lithographic Processing".

* cited by examiner

*Primary Examiner*—Diane I. Lee
*Assistant Examiner*—Chia-how Michael Liu
(74) *Attorney, Agent, or Firm*—Sterne, Kessler, Goldstein & Fox PLLC

(57) ABSTRACT

A system and method include an object supported on a moveable support, an optical system that transmits radiation onto the object, a support having an aperture therethrough, a sensor system coupled to the support, and a control system coupled to the sensor system and the moveable support. The sensor system is arranged with respect to the aperture to measure a surface of the object and send measurement signals to the control system, such that the control system generates control signals received and used by the moveable support to ensure that the surface of the object receiving light transmitted by the optical system through the aperture is in a focus plane of the optical system.

23 Claims, 6 Drawing Sheets

LITHOGRAPHIC APPARATUS AND DEVICE MANUFACTURING METHOD UTILIZING A METROLOGY SYSTEM WITH SENSORS

BACKGROUND

1. Field

The present invention relates to a lithographic apparatus and a method for manufacturing a device.

2. Related Art

A lithographic apparatus is a machine that applies a desired pattern onto a substrate or part of a substrate. A lithographic apparatus can be used, for example, in the manufacture of flat panel displays (FPDs), integrated circuits (ICs) and other devices involving fine structures. In a conventional apparatus, a patterning device, referred to as a mask or a reticle, can be used to generate a circuit pattern corresponding to an individual layer of a complete multi-layer device. This pattern can be transferred onto a substrate by imaging onto a layer of radiation-sensitive material (resist) provided on the substrate.

Instead of a circuit pattern, the patterning means can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A typical substrate can be round a round silicon wafer or a rectangular glass plate. Typically lithographic imaging systems have insufficient field to expose the full area of a substrate. To overcome this limitation the substrate can be scanned underneath image field, while the mask or reticle is synchronously scanned through the illumination beam. In this way, the pattern is transferred to a larger area of the substrate. If the scanned exposure region covers the full width and length of the substrate then exposure can be completed with a single scan. Otherwise, the substrate is stepped either laterally or in the scan direction, and the exposure process repeated until the entire substrate is exposed.

Alternatively the moving reticle or mask can be replaced by a stationary mirror array where the pattern is electronically generated by moving the mirrors as the resist coated substrate is scanned.

In order to properly pattern the substrate, the resist needs to be in a focal plane of a projection system. This is typically achieved through use of combination of a complex multi-axis metrology measurement system that controls the motion of the substrate stage often in 6 degrees of freedom, and separate sensors that measure the location of the substrate surface. The metrology components used to measure substrate position in the direction orthogonal to the substrate plane are expensive, and may occupy volume, which conflicts with space needed for other tool components.

Therefore, what is needed is a system and method that accurately measure a surface of an object, while reducing a number and/or complexity of devices in the system.

SUMMARY

In one embodiment of the present invention, there is provided a system comprising a support, a first pair of sensors, and a first sets of sensors. The support has an aperture therethrough. The first pair of sensors are coupled to the support on a first side of the aperture. The first set of sensors are coupled to the support on the first side of the aperture between the first pair of sensors and the aperture. All the sensors are positioned along an axis of motion of the support device.

Another embodiment of the present invention includes the above system in a lithographic apparatus that also comprises an illumination source, a patterning device, a substrate stage that holds the object, for example a substrate, a projection system, and a control system. The illumination source conditions a beam of radiation. The patterning device patterns the beam. The projection system is coupled to a first surface of the support and projects the patterned beam through the aperture and onto a target area of the substrate. All the sensors are coupled to a second surface, which is opposite the first surface, of the support. The control system receives signals from all the sensors and generates control signals therefrom. All the sensors are positioned along an axis of motion of the support device. The substrate stage receives the control signals and moves the substrate, such that a surface of the substrate that receives the patterned beam remains substantially in a focal plane of the projection system.

A further embodiment of the present invention provides a device manufacturing method that comprises the following steps. Patterning a beam of radiation. Projecting the beam of radiation through an aperture onto a target portion of a substrate using a projection system. Measuring a topography of the substrate. The topography measuring process comprises: measuring a surface of the substrate with a first pair of sensors positioned on a first side of the aperture, measuring the surface of the substrate with a first set of sensors positioned between the first pair of sensors and the aperture, and determining the surface topography of the surface of the substrate based on the measuring steps. The method also comprises moving the substrate based on the determined surface topography of the substrate, such that the surface of the substrate remains in a focal plane of the projection system.

In another embodiment of the present invention, a second pair of sensors and second set of sensors can be coupled to another side of the aperture, opposite to the side including the first pair and first set of sensors.

In another embodiment of the present invention the topography measuring process can be performed on an object other than a substrate and/or outside of a device manufacturing method.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
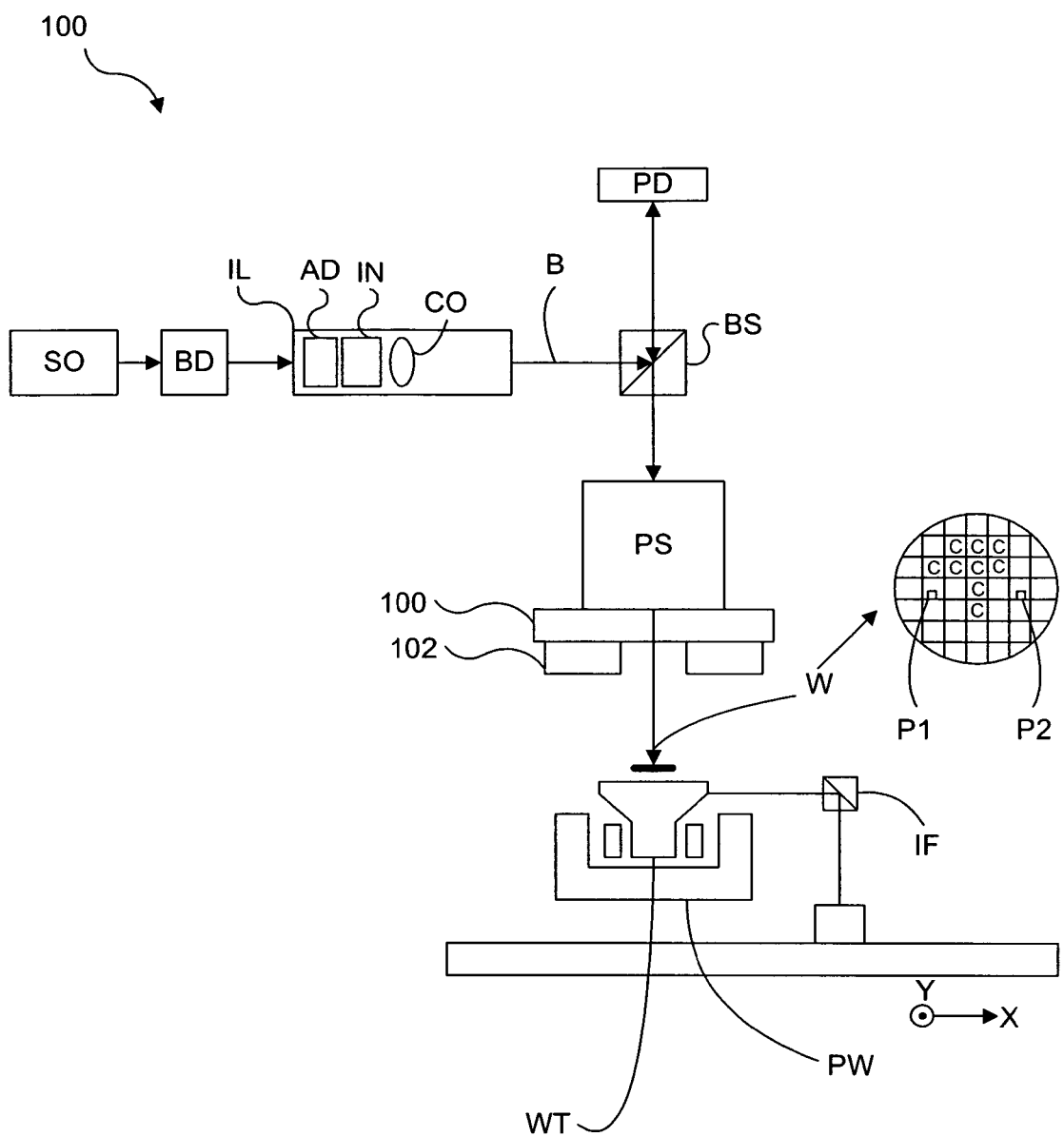
FIG. 1 depicts a lithographic apparatus, according to one embodiment of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION

One or more embodiments of the present invention include an object supported on a moveable support, an optical system that transmits patterned radiation onto the object, a support located between the optical system and the object having an aperture there through, one or more pairs and one or more sets of sensors coupled to that support, and a system that controls the motion of the moveable support. All the sensors are arranged with respect to the aperture to measure a surface of the object and send measurement signals to the control system, such that the control system generates control signals received and used by the moveable support to ensure that the surface of the object receiving light transmitted by the optical system through the aperture is in the focal plane of the optical system.

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

FIG. 1 schematically depicts a lithographic apparatus according to one embodiment of the invention. The apparatus comprises an illumination system IL, a patterning device PD, a substrate or wafer stage WT, and a projection system PS. The illumination system (illuminator) IL is configured to condition a radiation beam B (e.g., UV radiation).

The patterning device PD (e.g., a reticle or mask or an array of individually controllable elements) modulates the projection beam. In general, the position of the array of individually controllable elements will be fixed relative to the projection system PS. However, it can instead be connected to a positioner configured to accurately position the array of individually controllable elements in accordance with certain parameters.

The substrate stage WT is constructed to support a substrate (e.g., a resist-coated semiconductor or flat panel display substrate) W and connected to a positioner PW configured to accurately position the substrate in accordance with certain parameters.

The projection system (e.g., a refractive projection lens system) PS is configured to project the beam of radiation modulated by the patterning device PD onto a target portion C (e.g., comprising one or more dies) of the substrate W.

In one example, projection system PS is coupled to a support 100, which also has a metrology or sensor system 102 coupled thereto, as is described in more detail below.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a static patterning device, however it is to be appreciated that a dynamic pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

The lithographic apparatus can comprise one or more patterning devices PD. In such an arrangement, some or all of the patterning devices PD can have at least one of a common illumination system (or part of an illumination system), a common support structure for the reticle or arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

In example where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

In examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 μm, e.g., at least 100 μm, at least 200 μm, at least 300 μm, at least 400 μm, at least 500 μm, or at least 600 μm. In one example, the thickness of the substrate is at most 5000 μm, e.g., at most 3500 μm, at most 2500 μm, at most 1750 μm, at most 1250 μm, at most 1000 μm, at most 800 μm, at most 600 μm, at most 500 μm, at most 400 μm, or at most 300 μm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the patterning device PD, such that the pattern is coherently formed on the substrate.

Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

As herein depicted in FIG. 1, the apparatus is of a reflective type (e.g., employing a reflective patterning device PD). Alternatively, the apparatus can be of a transmissive type (e.g., employing a transmissive patterning device PD).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., a reticle or an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table or stage WT can be moved accurately, e.g., to position different target portions C in the path of the radiation beam B. Where used, the positioning means for the reticle or the array of individually controllable elements can be used to correct accurately the position of the patterning device PD with respect to the path of the beam B, e.g., during a scan.

In one example, movement of the substrate stage WT is realized with the aid of a long-stroke module (course positioning) and a short-stroke module (fine positioning), which are not explicitly depicted in FIG. 1. In one example, the apparatus is absent at least a short stroke module for moving substrate stage WT. A similar system can also be used to position the reticle or array of individually controllable elements. It will be appreciated that the projection beam B can alternatively/additionally be moveable, while the object table and/or the reticle or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate stage WT and the projection system PS can be fixed and the substrate W can be arranged to be moved relative to the substrate stage WT. For example, the substrate stage WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS that transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmissive patterning device is used.

The depicted apparatus can be used in several modes:

1. In step mode, the patterning device PD and the substrate are kept essentially stationary, while an entire pattern imparted to the radiation beam is projected onto a target portion C at one go (i.e., a single static exposure). The substrate stage WT is then shifted in the X and/or Y direction so that a different target portion C can be exposed. In step mode, the maximum size of the exposure field limits the size of the target portion C imaged in a single static exposure.

2. In scan mode, the patterning device PD and the substrate are scanned synchronously while a pattern imparted to the radiation beam is projected onto a target portion C (i.e., a single dynamic exposure). The velocity and direction of the substrate relative to the patterning device PD can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the patterning device PD is kept essentially stationary and the entire pattern is projected onto a target portion C of the substrate W using a pulsed radiation source. The substrate stage WT is moved with an essentially constant speed such that the projection beam B is caused to scan a line across the substrate W. The pattern on the patterning device PD is updated as required between pulses of the radiation system and the pulses are timed such that successive target portions C are exposed at the required locations on the substrate W. Consequently, the projection beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the patterning device PD is updated as the projection beam B scans across the substrate W and exposes it. A substantially constant radiation source or a pulsed radiation source, synchronized to the updating of the pattern on the patterning device PD, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched.

In one example, a reticle is scanned simultaneously with the wafer during the exposure, where as a mirror array is stationary, and only the generated pattern is synchronized with the wafer motion so that the combination of individual areas that are exposed by each laser pulse replicate the desired overall pattern on the wafer.

In one example, the optical system may contain multiple illumination systems, multiple imaging lenses, and multiple pattern generators. In the case where either multiple imaging lenses or pattern generators are used, focus may be maintained by adjusting the position of individual pattern generators or lenses rather then adjusting the substrate stage.

In one example, the substrate stage WT may have up to a six (6) degrees of freedom (DOF) of adjustment capability to allow any local region of the wafer surface to be aligned to the exposing image. The substrate stage typically incorporates metrology sensors to provide continuous feedback to the substrate stage control system consistent with the number of axes being controlled. In one example, interferometers, or special focus reference plates, were used to provide continuous feedback on stage motion in the direction orthogonal to the substrate surface (Z axis). However, according to another embodiment of the present invention a special array of gap sensors and control algorithms can replace the need for such a metrology system.

Figure 2:
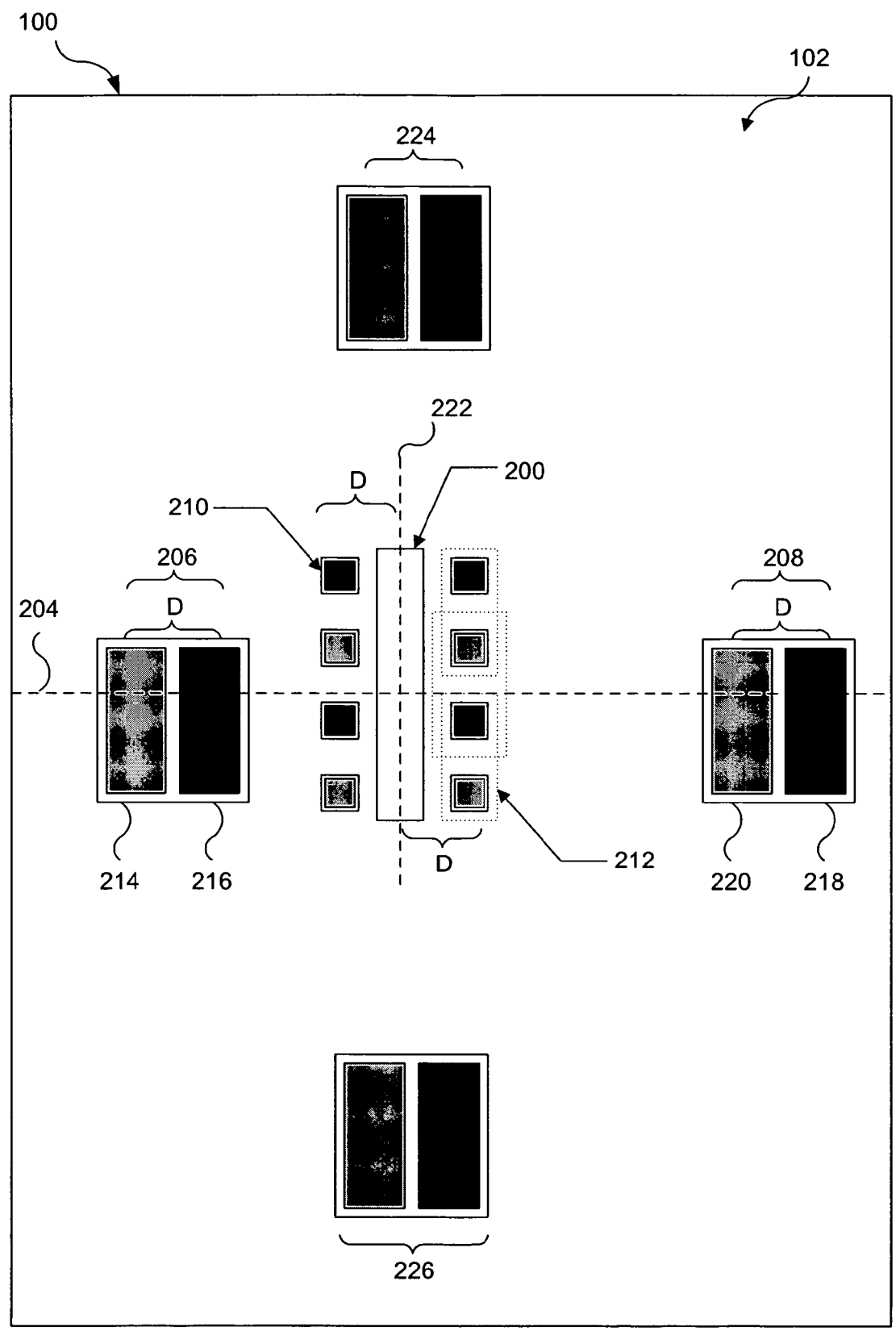
FIG. 2 depicts a top view of a sensor arrangement, according to one embodiment of the preset invention.

FIG. 2 depicts a top view of a sensor system 102, according to one embodiment of the preset invention. Throughout the rest of the description and in the figures, scanning in two directions is assumed, thus sensor system 102 can comprise two sets of sensors (e.g., having an array of four sensors per set, although other sized arrays can also be used) and two pairs of sensors are described. In another embodiment, when only one scan direction is used, one pair and one set of sensors can be eliminated, which is not explicitly shown.

In one example, sensors (described below) are arranged around an aperture 200 (e.g., an exposure aperture) in a support 100 along an axis of movement 204. For example, aperture 200 can be an exposure slot and support 100 can support projection optics (not shown, see FIG. 1), which example is discussed in more detail below. In this example, there are first and second pairs of sensors 206 and 208 and first and second sets of sensors 210 and 212. In one example, each set of sensors 210 and 212 includes an array of four (4) sensors.

In one example, first and second sets of sensors 210 and 212 function as topography sensors, first sensors 214 and 218 function as look-ahead sensors, and second sensors 216 and 220 function as control sensors.

In one example, all the sensors can be capacitor sensors, air or fluid gauge sensors or proximity sensors, or any combination of sensors having the ability to measure very small dimensions (e.g., on the order of micro to nano meters). Example fluid gauge sensors can be found in U.S. Pat. Nos. 4,953,388 and 4,550,592 and U.S. Published Patent Applications 2004-0118183, 2004-0118184, and 2005-0044963, which are all incorporated by reference herein in their entireties. In other examples, acoustic, optical, or mechanical sensors could also be used, as would be apparent to a skilled artisan upon reading and understanding this description.

In one example, first and second sensors 214 and 216 in first pair of sensors 206 are spaced a distance D apart and first and second sensors 218 and 220 in second pair of sensors 208 are also spaced a distance D apart. This distance D is equal to a distance D either of first set of sensors 210 or second set of sensors 212 are spaced from a central longitudinal axis 222 of aperture 200 (note: the elements are not drawn to scale, so D is not to scale for each section). Using this arrangement, surface sensor measurements taken from first and second pairs of sensors 206 and 208 are corrected to accurately emulate (match) measurements that a sensor would make if it were located at the exposure slit.

In alternative embodiment of the present invention, two additional pairs of sensors 224 and 226 can be coupled to support 100 to allow substrate stage θx and/or θy tilts to be determined without a physical back plane sensor system, as was used in conventional systems. In this embodiment, one pair of sensors 224 can be used to measure X substrate stage position and another pair of sensors 226 can be used to measure Y substrate stage position, thus allowing for the wafer stage θx and θy tilts to be determined.

Thus, according to this embodiment, FIG. 2 depicts a bottom view of an exemplary sensor system 102. This sensor system can be mounted on a support plate 100 that is attached to the imaging optics PS, or in another example to a common isolated support structure that mounts both the imaging optics PS, and other substrate stage metrology elements (not shown). In one example, first and second sets of sensors 210 and 212 are relatively "small area" gap sensors and are arranged on support plate 100 on either side of aperture 200 with the first and second sets of sensors 210 and 212 spaced along the direction of a scanning motion a distance D from the center of the exposing beam. First and second sets of sensors 210 and 212 are located just outside the path of the exposing light.

Depending of the direction of the exposing scan, one of the sets of sensors 210 or 212 detects surface topography a time T before the surface is exposed. In this direction, the first set of sensors to sense the surface are referred to as the "leading sensors." The sensors on the opposite side of the aperture 200 are referred to as the "trailing sensors" and provide no useful information until the scan direction is reversed. The time T is equal to the distance D divided by the scan velocity.

In this example, in addition to the first and second sets of sensors 210 and 212, there can be first and second pairs of sensors 206 and 208 can be relatively "larger area" sensors, as compared to the sensors in the first and second sets of sensors 210 and 212. In another example, there can by additional pairs of sensors 224 and 226, where the sensors in each pair are spaced the same distance D. One sensor 216 and 220 in each pair of sensors 206 and 208 can be considered larger area "control sensors," which are typically located in a pattern so that at least one pair measures the substrate at all times.

In one example, as with the first and second sets of sensors 210 and 212, depending of the scan direction, the control sensor 214 or 218 in each of the first and second pairs of sensors 206 and 208 that measures the topography first is called the leading sensor, and the other control sensor 216 or 220 is considered the trailing sensor. Unlike the first and second sets of sensors 210 and 212, however, both leading and trailing control sensors provide useful information. For example, the trailing control sensors 216 or 220 provides continuous high bandwidth feedback information along the Z axis to a substrate stage controller (not shown). The leading control sensor 214 or 218 provides additional correction for substrate surface topography. The relatively larger area of the control sensors 216 and 220 compared to the smaller area of the first and second sets of sensors 210 and 212 reduces the noise level in the Z axis servo.

Figure 3:
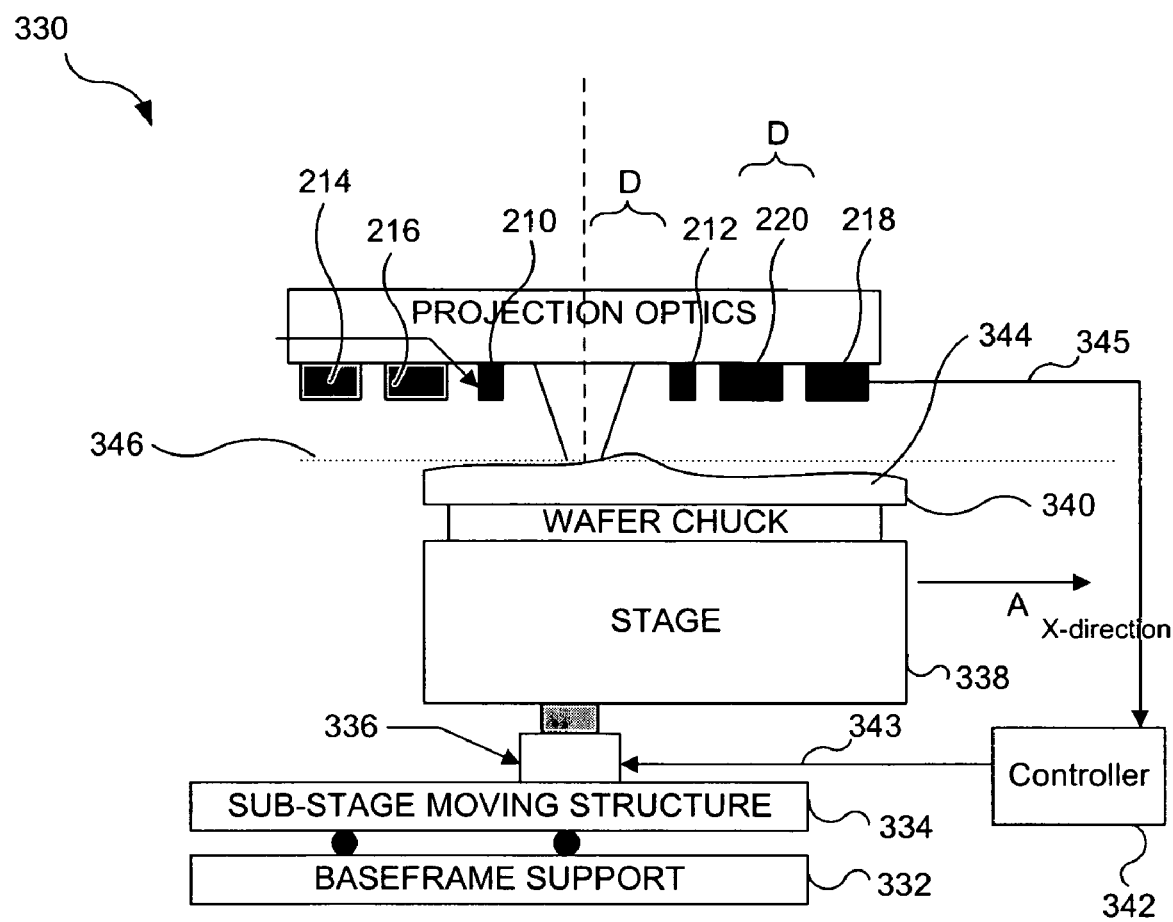
FIG. 3 depicts a side view of a sensor arrangement in an exemplary system at first and second positions in the exemplary system, according to one embodiment of the present invention.

FIG. 3 depicts a side view of a system 330 having sensor arrangement similar that described in relation to FIG. 2 at first and second positions in the exemplary system, according to one embodiment of the present invention. In this embodiment, system 330 is shown in terms of a lithography environment. System 330 includes a base frame support 332, a sub stage moving structure 334, a focus actuator 336, a substrate stage 338, a substrate 340, and a controller 342.

Stage 338 moves in the direction of arrow A (e.g., the X direction). In one example, focus actuator 336 receives and is controlled by a control signal 343 from controller 342 based on measured signals 345 from sensors, for examples sensors as described elsewhere in the description.

In the perspective shown in FIG. 3, second set of sensors 212 is the leading set of topography sensors and first set of sensors 210 is the trailing set of topography sensors and sensors 218 and 212 are the leading and trailing control sensors, respectively. Sensors 214 and 216 are inactive control sensors because they are off the wafer surface. The combined sensor data 345 is fed to controller 342, where it is processed into a drive signal 343 for actuator 336 that controls the Z axis of motion, which keeps the substrate surface in focus while the stage scans in the direction of arrow A. The combination of the leading topography sensor signal and the signals from both the leading and trailing active control sensors provides sufficient information to keep the wafer surface at the point of exposure in the imaging focal plane. Wafer topography does not introduce errors in focal position at the center of the exposing beam.

As discussed above, in an alternative embodiment additional pairs of control and look-ahead sensors can be used to allow for substrate stage θx and/or θy tilts to be determined without a physical back plane sensor system.

Typically, conventional metrology systems (e.g., virtual gauging focus systems), for example as described in U.S. Pat. No. 6,633,020 and U.S. Published Patent Applications 2002-0001180 and 2003-0201402, which are all incorporated by reference herein in their entireties, required both a front plane sensor system including topography measuring sensors and a focus back plane measuring system used to measure Z, θX and θY. However, according to at least above environment of the present invention in a lithography environment example, with reference to FIGS. 2 and 3, a front plane sensor arrangement 330 has pairs of control sensors 216 and 220 and look-ahead sensors 214 and 218 that work in conjunction with topography sensors 210 and 212 to continuously monitor a substrate surface 344. This allows for a simplified single degree of freedom (Z position or focus) version of the conventional more general substrate surface referenced "virtual gauging" focus system without requiring both front and back plane sensors, as was required in conventional systems. In one example, fist and second pairs of sensors 206 and 208 are strategically located so that one pair is always measuring surface 344. The actual physical focus back plane has been eliminated, and the Z focus servo utilizes the substrate surface control sensors 216 and 220 for real time feedback.

In one example, when only one direction of scan is used, only one side of aperture 200 has sensors (e.g., 206 and 210 or 208 and 212), and not both sides as shown.

Figure 4:
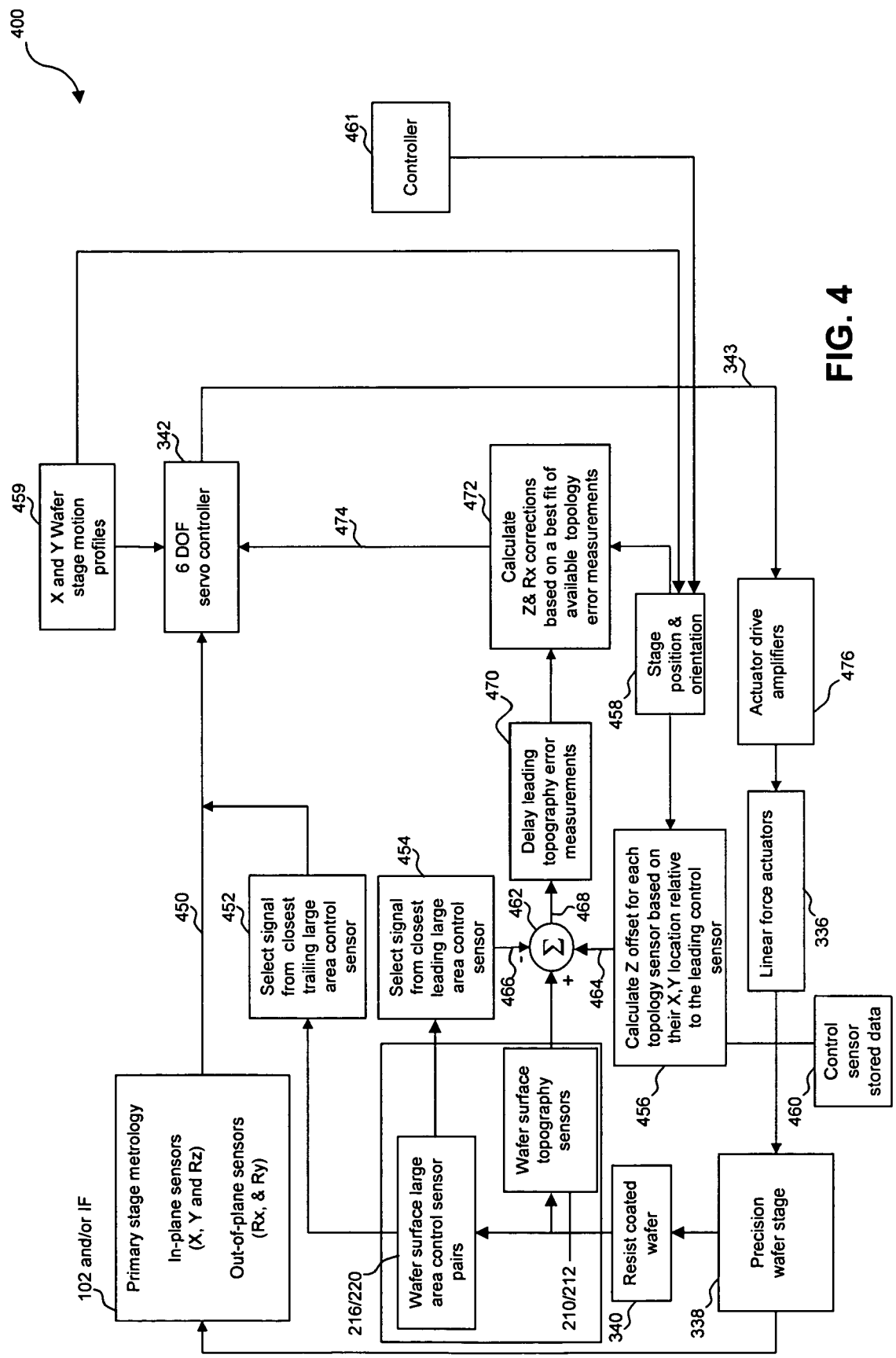
FIG. 4 is an operational diagram, according to one embodiment of the present invention.

FIG. 4 shows an operational flow diagram 400, according to one embodiment of the present invention. For example, the operations flow diagram 400 shows a focus control system and process, where a substrate is supported by a six degrees-of-freedom (DOF) stage, for example stage 338 (FIG. 3). Elements numbers of FIG. 3 discussed above will be used for illustration, but not as a limitation, of what devices can be used in operational flow diagram 400.

A surface 344 of substrate 340 along a Z axis (e.g., of a resist coated wafer) is measured by first and second sets of sensors 210 and 212, which can be, for example, capacitor gauges, air gauges, or other devices.

Substrate stage positions in X, Y, Rx, Ry and Rz degrees of freedom are sensed by in-plane sensors and out-of-plane sensors, for example interferometer IF (FIG. 1), that do not reference the substrate surface 344.

In one example, the interferometers IF provide continuous feedback signal 450 including X, Y, Rx, Ry, and Rz parameters.

In step 452, a signal is selected from the trailing control sensor 216 or 220 that is measuring the wafer surface 344, and closest to the exposing beam. This provides continuous feedback along the Z axis to allow a position and orientation of substrate stage 338 to be servo controlled in 6 DOF.

In one example, stage position based transformations of metrology signals are required to assure stability and performance of the servos.

In step 454, a lower bandwidth signal from the leading control sensor 216 or 220 is selected.

In step 456, signals form the leading topography sensors, e.g., either first or second sets of sensors 210 or 212, are corrected by subtracting the ideal positions of the wafer at each sensor location based upon X/Y stage position and Rx, Ry and Rz stage orientations from information received via the stage and position orientation data 458 and/or control sensor stored data 460. In alternative examples, data 458 is retrieved from either X and Y Wafer stage motion profiles 459 or a main lithographic tool controller 461.

Summer 462 subtracts a corrected leading control sensor signal 464 from a signal 466 from the leading one of the topography sensors 210 or 212 to generate a topography correction signal 468, which is independent of stage orientation.

In step 470, these corrected topography measurements are delayed for a time T (e.g., digitally delayed).

In step 472, using a least squares fitting algorithm, for example, reduces the Z corrected topography data to a Z and Rx correction signal 474 calculated at the center of the exposure aperture. This correction signal 474 is received at six (6) DOF controller 342, which in turn forwards control signals 343 to drive amplifiers 476 and actuators 336 to drive the stage 338.

Exemplary Operations

Figure 5:
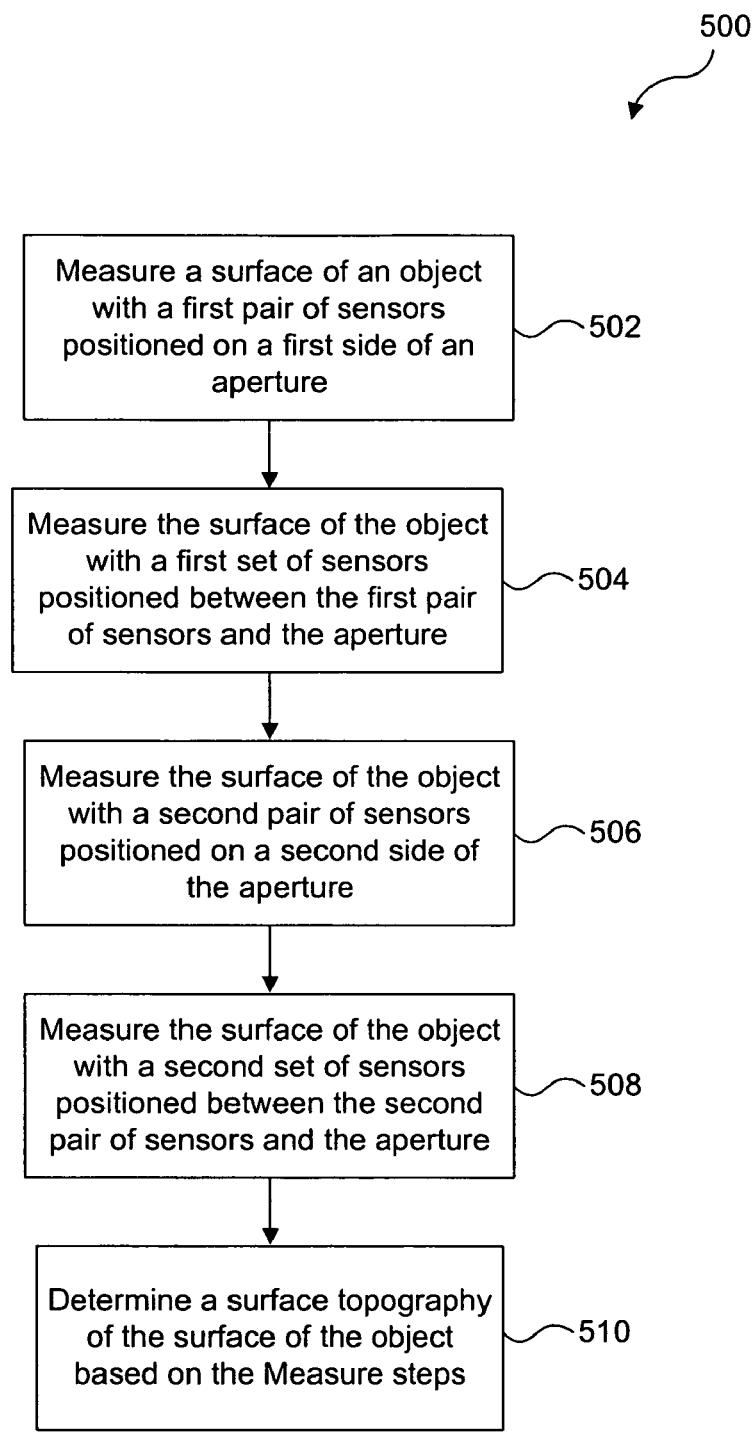
FIGS. 5 and 6 are flowcharts depicting methods, according to various embodiments of the present invention.

FIG. 5 shows a flowchart depicting a method 500, according to one embodiment of the present invention. For example, one or more of the systems described above can be used to perform method 500. In step 502, a surface of an object (e.g., a substrate, a wafer, etc.) is measured with a first pair of sensors (e.g., sensors 206 or 208) positioned on a first side of an aperture (e.g. 200). In step 504, the surface of the object is measured with a first set of sensors (e.g., sensors 210 or 212) positioned between the first pair of sensors and the aperture.

In one example, additional measuring steps are performed. In step 506, the surface of the object is measured with a second pair of sensors positioned on a second side of the aperture. In step 508, the surface of the object is measured with a second set of sensors positioned between the second pair of sensors and the aperture.

In both examples, in step 510, a surface topography of the surface of the object based on the measuring steps.

Figure 6:
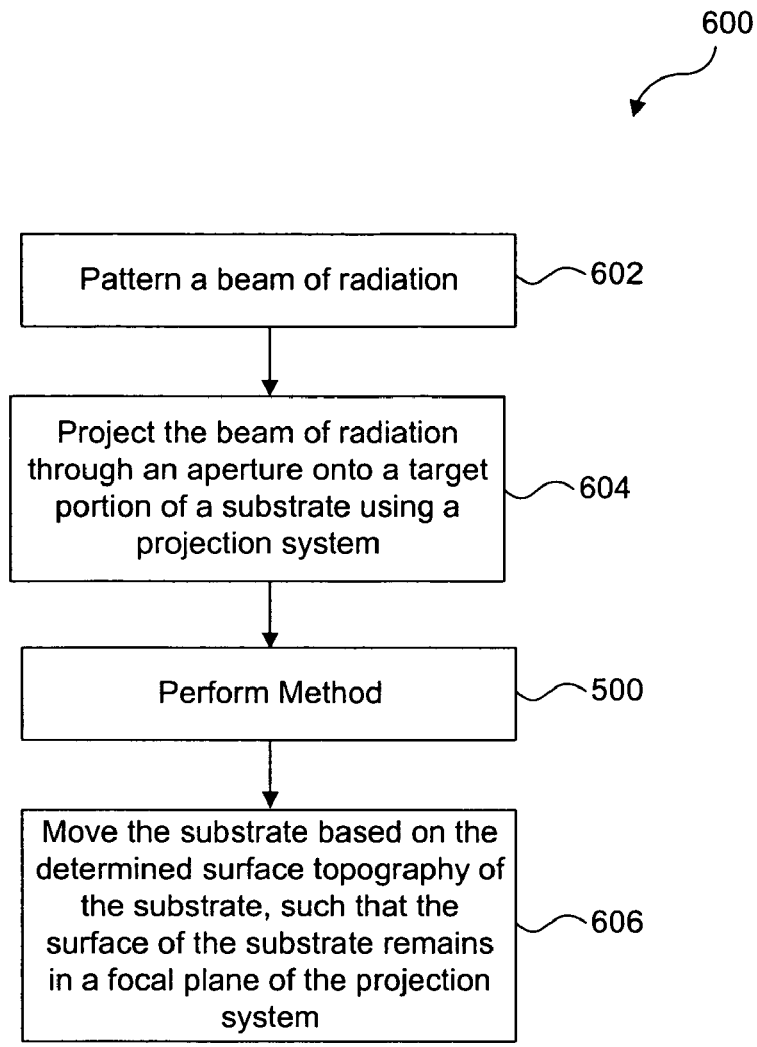

FIG. 6 shows a flowchart depicting a method 600, which includes method 500 shown as a single step, according to one embodiment of the present invention. For example, one or more of the systems described above can be used to perform method 600. For example, method 600 can be a device manufacturing method utilizing one or more of the above described systems. In step 602, a beam of radiation is patterned. In step 604, the patterned beam is projected through the aperture onto a target portion of a substrate using a projection system. Then method 500 is performed to measure a topography of the substrate. In step 606, the substrate is moved based on the determined surface topography of the substrate, such that the surface of the substrate remains in a focal plane of the projection system.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more, but not all exemplary embodiments of the present invention as contemplated by the inventor(s), and thus, are not intended to limit the present invention and the appended claims in any way.

What is claimed is:

1. A system, comprising:
a support having an aperture therethrough;
a first pair of sensors coupled to the support on a first side of the aperture; and
a first set of sensors coupled to the support on the first side of the aperture between the first pair of sensors and the aperture;
wherein the first set and first pair of sensors are positioned along an axis of motion of the support device, and
wherein a first sensor of the first pair of sensors is a leading sensor and a second sensor of the first pair of sensors is a trailing sensor with respect to the axis of motion.

2. The system of claim 1, wherein first and second sensors in the first pair of sensors are spaced a same distance apart as a distance between the first set of sensors and a central longitudinal axis of the aperture.

3. The system of claim 1, further comprising:
a second pair of sensors coupled to the support on a second, opposite side of the aperture; and
a second set of sensors coupled to the support on the second side of the aperture between the second pair of sensors and the aperture.

4. The system of claim 3, wherein:
a first and second sensor in the first pair of sensors are spaced a same distance apart as a distance between the first set of sensors and a central longitudinal axis of the aperture; and
a first and second sensor in the second pair of sensors are spaced a same distance apart as a distance between the second set of sensors and the longitudinal axis of the aperture.

5. The system of claim 1, wherein:
the first set of sensors measures a topography of a surface of a substrate.

6. The system of claim 1, further comprising:
third and fourth pairs of sensors coupled to the support on respective third and fourth sides of the aperture.

7. The system of claim 1, wherein the first set of sensors comprises an array of four sensors.

8. The system of claim 1, wherein the first set and pair of sensors comprise capacitive sensors.

9. The system of claim 1, wherein the sensors comprise fluid gauge sensors.

10. The system of claim 1, further comprising:
a control system that receives signals from all the sensors and generates control signals therefrom;
an optical system coupled to an opposite surface of the support than a surface on which the sensors are coupled, the optical system directing a patterned beam of radiation generated by a patterned device;
an object positioned to receive the patterned beam; and
a moveable object support that moves the object based at least on the control signals, such that a surface of the object that receives the patterned beam remains substantially in a focal plane of the optical system.

11. The system of claim 10, wherein the object is a display screen of a projection system.

12. The system of claim 10, wherein the object is a wafer.

13. The system of claim 10, wherein the object is a flat panel display substrate.

14. A lithographic apparatus, comprising:
an illumination source that conditions a beam of radiation;
a patterning device that patterns the beam;
a substrate stage that holds a substrate;
a support having an aperture therethough;
a projection system coupled to a first surface of the support that projects the patterned beam through the aperture and onto a target area of the substrate;
a first pair of sensors coupled to a second surface, which is opposite the first surface, of the support on a first side of the aperture;
a first set of sensors coupled to the second surface of the support on the first side of the aperture between the first pair of sensors and the aperture; and
a control system that receives signals from the sensors and generates control signals therefrom,
wherein the sensors are positioned along an axis of motion of the support device such that a first sensor of the first pair of sensors is a leading sensor and a second sensor of the first pair of sensors is a trailing sensor with respect to the axis of motion, and
wherein the substrate stage receives the control signals and moves the substrate, such that a surface of the substrate that receives the patterned beam remains substantially in a focal plane of the projection system.

15. The lithographic apparatus of claim 14, further comprising:
a second pair of sensors coupled to the second surface of the support on a second, opposite side of the aperture; and
a second set of sensors coupled to the second surface of the support on the second side of the aperture between the second pair of sensors and the aperture.

16. The lithographic apparatus of claim 14, wherein the substrate comprises a semiconductor wafer.

17. The lithographic apparatus of claim 14, wherein the substrate comprises a flat panel display substrate.

18. A method, comprising:
(a) measuring a surface of an object with a first pair of sensors positioned on a first side of an aperture, each sensor of the first pair of sensors being located on a common axis, a first sensor of the first pair of sensors being located closer to the aperture than a second sensor of the first pair of sensors;

(b) measuring the surface of the object with a first set of sensors positioned between the first pair of sensors and the aperture; and (c) determining a surface topography of the surface of the object based on the measuring steps.

19. The method of claim 18, wherein before step (c) the method further comprises:

measuring the surface of the object with a second pair of sensors positioned on a second side of the aperture; and measuring the surface of the object with a second set of sensors positioned between the second pair of sensors and the aperture.

20. The method of claim 19, further comprising:

positioning first and second sensors in respective ones of the first and second pairs of sensors a same distance apart as a distance from a central longitudinal axis of the aperture to a respective one of the first and second sets of sensors.

21. A device manufacturing method, comprising:

(a) patterning a beam of radiation;

(b) projecting the beam of radiation through an aperture onto a target portion of a substrate using a projection system;

(c) measuring a topography of the substrate, comprising, (i) measuring a surface of the substrate with a first pair of sensors positioned on a first side of the aperture, each sensor of the first pair of sensors being located on a common axis, a first sensor of the first pair of sensors being located closer to the aperture than a second sensor of the first pair of sensors;

(ii) measuring the surface of the substrate with a first set of sensors positioned between the first pair of sensors and the aperture; and (iii) determining the surface topography of the surface of the substrate based on the measuring steps, and (d) moving the substrate based on the determined surface topography of the substrate, such that the surface of the substrate remains in a focal plane of the projection system.

22. The method of claim 21, wherein before step (c)(iii) the method further comprises:

measuring the surface of the substrate with a second pair of sensors positioned on a second side of the aperture; and measuring the surface of the substrate with a second set of sensors positioned between the second pair of sensors and the aperture.

23. The device manufacturing method of claim 21, further comprising:

positioning first and second sensors in the first pair of sensors a same distance apart as a distance from a central longitudinal axis of the aperture to the first set of sensors.

* * * * *